United States Patent [19]
Modiano

[11] 3,936,732
[45] Feb. 3, 1976

[54] TRAVELING WAVE TUBE BODY CURRENT SENSOR

[75] Inventor: Victor J. Modiano, Anaheim, Calif.

[73] Assignee: The United States of America as represented by the Secretary of the Air Force, Washington, D.C.

[22] Filed: Dec. 31, 1974

[21] Appl. No.: 537,791

[52] U.S. Cl. .................. 330/43; 315/3.5; 315/276; 315/277; 324/127
[51] Int. Cl.² ............................................ H03F 3/58
[58] Field of Search ........ 330/43; 315/3.5, 3.6, 276, 315/277, 278; 331/82; 324/126, 127

[56] References Cited
UNITED STATES PATENTS

| | | | |
|---|---|---|---|
| 2,712,635 | 7/1955 | Borg | 324/127 |
| 2,950,438 | 8/1960 | Gilbert | 324/127 X |
| 3,165,696 | 1/1965 | Poole | 315/3.5 X |
| 3,566,180 | 2/1971 | Ewton | 315/3.5 |
| 3,573,536 | 4/1971 | Palmer | 315/3.5 |

Primary Examiner—Saxfield Chatmon, Jr.
Attorney, Agent, or Firm—Joseph E. Rusz; Robert Kern Duncan

[57] ABSTRACT

The body current of a TWT (traveling wave tube) is measured by generating a voltage that is proportional to the difference between the cathode and collector currents of the TWT without materially affecting either by passing the cathode and collector currents through separate transformer windings, wound in opposition, on both a linear core transformer and a nonlinear core transformer with separate windings coupling each transformer to the other. A voltage pulse is introduced into another winding on the nonlinear transformer causing a current flow in the circuit coupling the two transformers, the voltage magnitude of which is proportional to the difference between the cathode and collector currents which is the body current.

2 Claims, 2 Drawing Figures

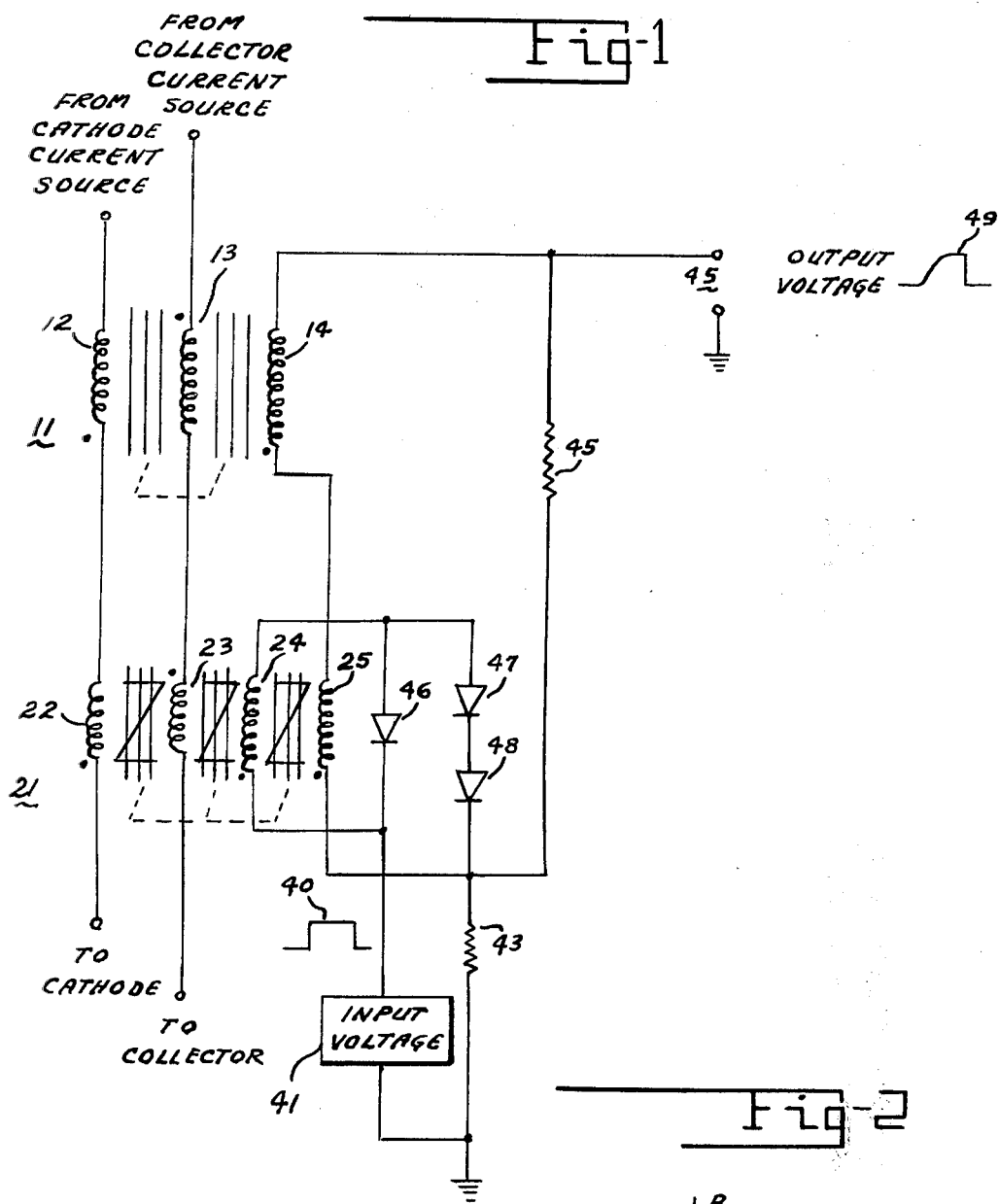
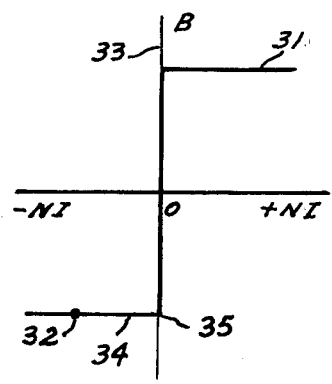

TRAVELING WAVE TUBE BODY CURRENT SENSOR

RIGHTS OF THE GOVERNMENT

The invention described herein may be manufactured and used by or for the Government of the United States for all governmental purposes without the payment of any royalty.

BACKGROUND OF THE INVENTION

The field of the invention is in the measurement of traveling wave tube operation.

In a continuous traveling wave tube, it is important to know when the body current exceeds a safe value so that operating parameters may be adjusted to return operation to a safe value and prevent the destruction of the tube.

Related prior art concerned with traveling wave tubes and the measurements of currents through a conductor associated with a transformer core may be found in the following patents. Ewton U.S. Pat. No. 3,566,180 teaches a TWT helix current limiting circuit for focusing. Palmer U.S. Pat. NO. 3,573,536 teaches the use of a bridge circuit between the cathode and the slow wave structure. Schroder U.S. Pat. No. 3,624,630, Mayer U.S. Pat. No. 3,550,110, Mishkovsky U.S. Pat. No. 3,419,791, Hill U.S. Pat. No. 3,417,310, and Hoft et al. U.S. Pat. No. 2,888,645 teach the use of magnetic cores cooperating with associated circuitry to effect measurement of current through a conductor associated with the core.

SUMMARY OF THE INVENTION

An economical, compact, combination of a relatively few components provides a unique circuit for measuring the body current of a traveling wave tube that responds rapidly to body current changes yet in measuring the body current the device injects only a negligible amount of voltage change at the cathode of the traveling wave tube.

BRIEF DESCRIPTION OF THE DRAWING

FIG. 1 is an electronic schematic diagram of a typical embodiment of the invention; and FIG. 2 is a simplified representative plot of the magnetization characteristics of typical nonlinear transformer core material.

DESCRIPTION OF THE PREFERRED EMBODIMENT

The importance of knowing the body current of a continuous traveling wave tube and when it is exceeding a safe value is well recognized. Since the body current cannot be measured directly it must be measured by taking the difference between the cathode and collector currents, this being equivalent to the body current. These measurements present no great problem in the laboratory where complex equipment is readily available and set up time is not a great problem. It is, however, a somewhat involved set up. When traveling wave tube replacements are made in the field an expedient means of measuring body current has been a long felt need. The apparatus disclosed herein fulfills this need for field operation and in addition it provides a convenient system for monitoring the operation of traveling wave tubes both in the laboratory and in the field.

FIG. 1 is a schematic diagram of a typical embodiment of the invention. The apparatus is serially connected in the lines between the power sources for the cathode and the collector of a traveling wave tube as indicated. The upper transformer 11 has a conventional, commonly called, linear core. The lower transformer 21 has a conventional, commonly called, nonlinear core with a typicla ampere-turn flux density diagram as shown in FIG. 2. Typically, the transformers are torroidal core transformers with all the windings of each transformer on a common core as indicated. The polarities of the windings are critical. The windings 12 and 22 carrying the cathode current 13 and 23 carrying the collector current are wound in opposition on each transformer as indicated. The differences in the ampere-turn magnetizing currents in these windings provide a magnetization of the core materials of the transformers. In the nonlinear core transformer 21 this is represented in the typical magnetization curve 31 shown in FIG. 2 at the location 32 on the curve. When a positive voltage pulse 40 of a short duration (typically 10 $\mu$sec) is introduced on winding 24 from conventional pulse generator 41, no flux change occurs to oppose any current flow until the current through resistance 43 is such that the ampere-turns in winding 24 becomes equal to the effective ampere-turns of windings 22 and 23 which produced the point 32 in the magnetization curve. With a short rise time pulse 40 this occurs almost instantly. Then the flux begins to change and the current through resistance 43 remains essentially constant to the end of the pulse when it returns to zero. During the time the flux was changing, a voltage was introduced on the other windings. It is desired to minimize any voltage change introduced on the cathode and collector lines. This is accomplished by impressing the induced voltage on windings 22 and 23 of the nonlinear core 21 by winding 24 by taking a voltage representative of this change that is introduced in winding 25 and using this voltage to drive winding 14 on the linear core 11 to effectively cancel out the total induced voltage change in the cathode and collector lines.

Ideally there is a unity of turns ratio between windings 12, 13, 22, and 23 and another unity of turns ratio between windings 14, 24, and 25. Referring to FIG. 2 the difference between the cathode current and the collector current, (i.e., the body current), establishes a point 32 on the magnetization curve 31 of nonlinear core 21. When the pulse 40 is applied to winding 24 the current flow is a non-magnetizing current until the ampere-turns magnetizing force in winding 24 overcome the field represented by point 32 established by windings 22 and 23. While the current is building up in winding 24 the point 32 is moving back toward axis 33 along line 34. This is referred to as non-magnetizing current flow because there is substantially no change in flux density in the core while this is taking place. When the pulse current produces sufficient ampere-turns in the nonlinear core transformer 21 to move the point 32 past the knee 35 of the curve 31 magnetization current starts flowing with corresponding changes in flux density. This non-magnetizing current of the injected pulse appears across the output terminals 45 of the device as a magnitude of pulse voltage proportional to the body current in the traveling wave tube. As it can be seen from FIG. 2 the larger the -NI established by the difference between the cathode and collector currents the greater the amount of non-magnetizing current flow.

With unit transformer windings the ohmic value of resistances 43 and 44 should be the same. The diodes 46, 47, and 48 are conventional diodes suitable for high frequency pulse application. They are not critical. The voltage magnitude of the output pulse 49 at terminals 45 may be read on a conventional voltage calibrated oscilloscope or any other suitable conventional peak reading meter, and this peak voltage calibrated with corresponding values of body current.

In a typical operating embodiment of the invention the linear core transformer 11 was wound on a ferrite torroid having an outside diameter of approximately 0.87 inches, an inside diameter of approximately 0.54 inches and a height of approximately 0.25 inches. (Ferroxcube type 3E2A-846T250 is suitable core material.) The nonlinear core transformer 21 was a 1 mil tape wound supermalloy torroid having an outside diameter of approximately 0.75 inches, an inside diameter of approximately 0.5 inches and a height of approximately 0.125 inches. (Arnold type 3T3340-X1-AA is suitable core material.) Windings 14, 24, and 25 were each three-hundred turn windings. Windings 12, 13, 22, and 23 were sixty-turn windings. These values of windings are not critical and may be adjusted to suit the materials and winding configurations used. Likewise, the specific physical dimension and specific core materials are not critical. In some instances it may be desirable to increase the number of turns 3 or 4 on the collector winding 13 of the linear core transformer 11 in order to optimize the operating region of the core. (That is, from the idealized 60-turn value for this particular embodiment.)

An embodiment constructed as set forth in detail in a typical operating environment provided a peak output voltage 49 that was approximately 0.4 volt, when a constant 10 μsec, 10 volt input pulse 40 was used, when the differential current (body current) was 20 milliamperes. This peak magnitude of output voltage was proportional to the body current (the input pulse 40 staying constant) and the ripple induced at the cathode terminals of the traveling wave tube was less than 20 mv. peak to peak.

I claim:

1. A traveling wave tube body current sensor for serially connecting between the cathode of the traveling wave tube and the cathode current power source and serially connecting between the collector of the traveling wave tube and the collector current power source, providing an output voltage proportional to the said body current, the said sensor comprising:

a. a linear core transformer having a first winding and a second winding of substantially unity turns ratio wound in opposition, and a third winding; each winding having an input and an output connection;

b. a nonlinear core transformer having a first winding and a second winding of substantially unity turns ratio wound in opposition, and a third winding, and a fourth winding, each winding having an input and an output connection;

c. means for serially connecting the said first winding of the said linear core transformer with the said first winding of the said nonlinear core transformer and serially connecting the said serially connected first windings between the said cathode current source and the said cathode of the traveling wave tube;

d. means for serially connecting the said second winding of the said linear core transformer with the said second winding of the said nonlinear core transformer and serially connecting the said serially connected second windings between the said collector current source and the said collector of the traveling wave tube;

e. a pulse generator providing a constant pulse voltage;

f. means including a first resistance for applying the said pulse voltage to the said third winding of the said nonlinear core transformer through the said first resistance;

g. means for serially connecting the said third winding of the said linear core transformer with the said fourth winding of the said nonlinear core transformer;

h. a second resistance connected across the said serially connected third and fourth windings;

i. means for connecting the said first resistance to the said second resistance; and j. means for providing an output connection across the said connected first and the said second resistance.

2. The apparatus as claimed in claim 1 wherein the turns ratio between the said first winding of the linear core transformer and the said first winding of the nonlinear core transformer is substantially unity, the turns ratio between the said third winding of the said linear core transformer and the said fourth winding of the said nonlinear core transformer is substantially unity, and the ohmic value of the said first resistance and the ohmic value of the said second resistance are substantially equal.

* * * * *